(12) United States Patent
Chen

(10) Patent No.: US 6,486,692 B1
(45) Date of Patent: Nov. 26, 2002

(54) METHOD OF POSITIVE MOBILE IRON CONTAMINATION (PMIC) DETECTION AND APPARATUS OF PERFORMING THE SAME

(75) Inventor: Wei-Fan Chen, Taichung (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/503,680

(22) Filed: Feb. 14, 2000

(30) Foreign Application Priority Data

Nov. 22, 1999 (TW) ........................................ 88120343 A

(51) Int. Cl.⁷ .......................... G01R 31/26; G01N 27/00
(52) U.S. Cl. ........................ 324/765; 324/769; 324/71.1
(58) Field of Search ............................. 324/765, 158.1, 324/769, 71.1, 71.5, 760; 257/344; 438/385, 17

(56) References Cited

U.S. PATENT DOCUMENTS

| | | | |
|---|---|---|---|
| 4,978,915 A | * 12/1990 | Andrews, Jr. et al. | 324/765 |
| 5,838,161 A | * 11/1998 | Akram et al. | 324/755 |
| 6,025,734 A | * 2/2000 | Hsu et al. | 324/769 |

OTHER PUBLICATIONS

IEEE standard Dictionary of Electrical and Electronics Terms, 3rd Edition, Jul. 20, 1984, p. 776 (one page).*

* cited by examiner

Primary Examiner—Vinh P. Nguyen
Assistant Examiner—Paresh Patel
(74) Attorney, Agent, or Firm—Ladas & Parry

(57) ABSTRACT

A positive mobile iron contamination (PMIC) detection apparatus disposed on a semiconductor substrate. An active region is defined on the semiconductor substrate using field oxide layers, and an MOS transistor is disposed in the active region. The positive mobile iron contamination (PMIC) detection apparatus comprises a heating device, a temperature-taking device, and a gate. The heating device is disposed on the surfaces of the field oxide layers so as to heat the semiconductor substrate. The temperature-taking device is disposed on the surface of the heating device so as to take the temperature of the semiconductor substrate and further to be the base for adjustment. The gate is disposed above the heating device, so as to receive a bias. The heating device can be a polysilicon layer; the temperature-taking device can be aluminum wire of the Kelvin structure; the externally connected current meter can measure charge pumping currents under various conditions, so as to calculate the quantity of positive mobile iron contamination.

5 Claims, 7 Drawing Sheets

Original status

Apply a negative bias

Apply a positive bias

METHOD OF POSITIVE MOBILE IRON
CONTAMINATION (PMIC) DETECTION AND
APPARATUS OF PERFORMING THE SAME

FIELD OF THE INVENTION

The present invention relates to a method and apparatus for positive mobile iron contamination (PMIC) detection.

DESCRIPTION OF THE PRIOR ART

One of the most serious problems encountered during early MOS technology development was an electrical instability now known as "the mobile ion problem". MOS transistor devices fabricated by using planar technology exhibit threshold voltages (VT) more negative than predicted by theoretical calculation. In addition, under a bias at elevated temperature, MOS transistor devices are extremely unstable. As the positive gate bias increases, the threshold voltages (VT) of MOS transistor devices will shift to more negative values. The magnitude and rate of the VT shift increases with temperature. On the other hand, a negative gate bias, without the shift effect of VT, produces stable device characteristics. It is now well-established that the instability in early planar processed MOS transistors was due to the drift of positive mobile irons(particularly Na+ and K+) in the gate oxide.

However, positive mobile ions are often introduced into the gate oxide during "metals and planarization etching" and "photoresist stripping", and these manufacturing processes are indispensable steps to multilayer metal processing (MLM processing). Therefore, as the dimensions of devices shrink, it takes a wafer level reliability(WLR) test to determine which manufacturing process has introduced PMIC, and further to seek the solution to reduce or eliminate PMIC.

Usually, the common strategies for reducing PMIC include reducing the PMIC concentration in the gate oxide, rendering the irons in the gate oxide immobile, neutralizing the irons in the gate oxide. For example, by depositing phosphorus silicon glass (PSG) over the surface of the gate oxide, implanting phosphorus ions in the polysilicon gate, and using PSG as interface dielectrics, the gettering of the positive mobile ions to the gate oxide is obtained. Or, by doping chlorine ions into $Si/SiO_2$ interface during the gate oxide growth, and using chlorine ions during pre-oxidation cleaning of furnace tubes, the positive mobile ions in the gate oxide are neutralized. Or, by improving the impurities of the chemicals or gases, and improving the equipment and wafer cleaning technique, a cleaner fabrication line is provided.

For the present technique, the wafer level reliability (WLR) test usually measures the quantity and location of PMIC along with the apparatuses of SEM/EDS, XSEM, XTEM, and three-dimensional SIMS etc. These apparatuses may precisely detect the quantity and location of PMIC, but there are several drawbacks. First, these apparatuses are very expensive and need experts to operate and analyze the results. Secondly, all these apparatuses use destructive measuring methods, so the throughput is very low. It is therefore considered desirable to explore how to complete the WLR test under the conditions of non-destructivity, low cost, and high throughput.

During the fabricating process of integrated circuits, the concentration of PMIC is usually calculated by using the difference value of the flatband voltage when applying bias and temperature stress to an MOS capacitance to get a Capacitance-Voltage (C-V) curve.

FIGS. 1A~1D are schematic diagrams showing how PMIC is measured by using the bias and temperature stress (BTS) technique. Before any bias and temperature stress are applied, the positive mobile ions are evenly distributed in the gate oxide, as shown in FIG. 1A. First, a positive bias of magnitude about 1~2 MV/cm is applied to the polysilicon or metal gate in order to push the mobile positive ions in the gate oxide to the interface between the semiconductor substrate and the gate oxide, as shown in FIG. 1B. Then, the stress temperature is gradually raised to 100 ~200° C., and this temperature is maintained for 3~50 minutes. Then, the stress temperature is gradually decreasing to room temperature, and the positive bias is removed to measure an electric field change. Then, a negative bias of the magnitude about −1~−2 MV/cm is applied to the polysilicon/ metal gate, and all the positive mobile ions in the gate oxide are attracted to the interface between the polysilicon/metal gate and the gate oxide, as shown in FIG. 1C, and all the steps mentioned above are repeated to measure another electric field change. Thus, the concentration of PMIC can be calculated through the difference value of the flatband voltage, as shown in FIG. 1D; that is:

$$N_M = \frac{C_{OX^1} \Delta V_{FB^1}}{q}$$

However, this technique is applicable to thin oxide layers, but unable to monitor PMOS in thick oxide layers.

FIGS. 2A~2C are schematic diagrams showing that the triangular voltage scan(TVS) technique is used to measure PMIC. As shown in FIGS. 2A~2B, the TVS technique first applies a positive bias VG and a stress temperature T to the polysilicon/metal gate. Then, the stress temperature T is lowered drastically to a low temperature of about −20° C. to trap the positive mobile ions into the interface between the semiconductor substrate and the gate oxide. At this stage, the positive mobile ions don't have enough kinetic energy, so there is no current generated even though the electric field changes. Then, the stress temperature T is gradually rising from the low temperature at the rate of about 0.5°C./sec. When the stress temperature T rises, the positive mobile ions trapped into the interface between the semiconductor substrate and the gate oxide will be thermally excited out. In FIG. 2C, two peaks of the displacement current are the locations where $Na^+$ and $K^+$ are thermally excited out, respectively. Since the excited energy of $Na^+$ is smaller than that of $K^+$; that is $E(Na^+) < E(K^+)$, the displacement current peak of $K^+$ will be on the right side of that of $Na^+$. Further, the quantities of $Na^+$ and $K^+$ are respectively proportional to the areas under the current peaks of $Na^+$ and $K^+$.

However, a displacement current detected by using this technique is very weak, so it takes a larger chip area and the junction capacitance also causes a very large experimental error.

FIGS. 3A~3C are schematic diagrams of MPIC also measured by using the TVS technique. As shown in FIGS. 3A~3B, the TVS technique first applies the positive bias (VG) and the stress temperature T to the polysilicon/metal gate, so as to keep the PMIC in the interface between the semiconductor substrate and the gate oxide by using the electric field. Then, the positive bias (VG) is adjusted to the initial condition and then gradually decreased at the rate of 5~100 mV/s. When the electric field changes, the mobile positive ions will drift and diffuse into the interface between the polysilicon/metal gate and the gate oxide. In FIG. 3C, the two current peaks are the locations where $Na^+$ and $K^+$ are resolved respectively, and the quantities of Na$^+$ and K$^+$ are respectively proportional to the areas under the current peaks of Na$^+$ and K$^+$, as shown in FIG. 2C.

However, this technique is only applicable to thin oxide layers, and cannot be used to monitor PMIC in thick oxide layers.

SUMMARY OF THE INVENTION

Therefore, it is the principal object of the invention to provide an apparatus and method for measuring PMIC, wherein the location and quantity of PMIC can be rapidly measured during the WLR test.

It is another object of the invention to provide an apparatus and method for measuring PMIC, wherein the kinetic energies of Na$^+$ and K$^+$ are raised by using the power dissipation produced by polysilicon resistance, so as to effect the measurement within a short time.

It is another object of the invention to provide an apparatus and method for measuring PMIC, wherein the measurement of PMIC can be completed nondestructively with the advantages of low cost and high resolution.

To achieve the objects mentioned above and others, the invention provides an apparatus and method for measuring PMIC disposed on the semiconductor substrate. By using field oxide layers, an active region is defined on a semiconductor substrate, in which an MOS transistor is disposed. The apparatus for measuring PMIC comprises a heating device, a temperature-taking device, and a gate. The heating device is disposed on the surfaces of the field oxide layers so as to heat the semiconductor substrate. The temperature-taking device is disposed on the surface of the heating device so as to take the temperature of the semiconductor substrate and further to be the base for adjustment. The gate is disposed above the heating device so as to receive a bias. The heating device can be a polysilicon layer; the temperature-taking device can be aluminum wire of the Kelvin structure; the externally connected current meter can measure the charge pumping current of the semiconductor substrate under various conditions, so as to measure the quantity of PMIC.

Further, the invention also provides a method for measuring mobile positive ions. First, a semiconductor substrate is provided, wherein the PMIC is randomly distributed in the dielectric layer between the semiconductor substrate and the gate. Then, the negative bias of −1~−2V and the positive bias of +1~+2V are applied separately via the gate so as to attract PMIC to the interface between the dielectric layer and the gate and push it to the interface between the dielectric layer and the semiconductor substrate, and a current is applied to the polysilicon heater so as to heat the whole semiconductor substrate up to the temperature of 400° C. for about one minute. When the negative bias is applied, the gate and the source/drain region are connected to the ground (0V), and the semiconductor substrate is also connected to the ground (0V). When the positive bias is applied, the gate of the MOS transistor and the semiconductor substrate are connected to the positive power supply (+5V), and the source/drain region of the MOS transistor is connected to the ground (0V). Then, the testing temperature is again lowered to room temperature, and the charge pumping currents are separately measured by using a current meter. Thus, the difference value of the two charge pumping currents can be used as the corresponding value for mobile ions, so as to calculate the quantity and location of PMIC.

BRIEF DESCRIPTION OF THE DRAWINGS

The present invention can be more fully understood from the following detailed description and preferred embodiment with reference to the accompanying drawing in which.

DETAILED DESCRIPTION OF THE PREFERRED EMBODIMENT

To save testing time during the wafer level reliability (WLR)test, field oxide layers according to the invention are covered with a polysilicon layer, and the structure to be tested is heated by using the power dissipation(IR$^2$) produced by the resistance effect, so as to raise the mobility of the PMIC (such as Na$^+$ and K$^+$) and further to get to the predetermined location within a short time and effect the measurement.

Figure 1A:
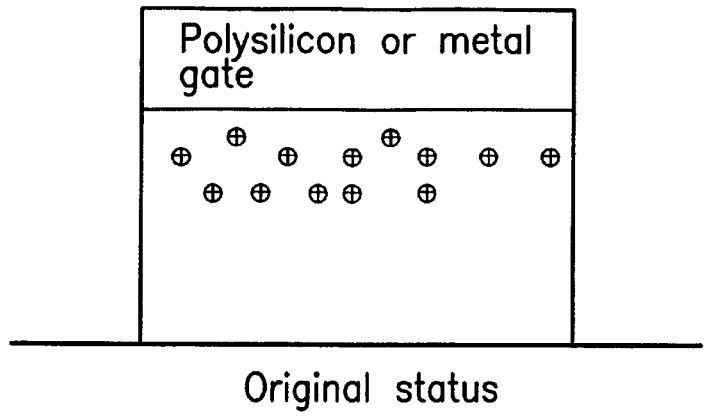
FIGS. 1A~1D are schematic diagrams in which PMIC is measured by using the BTS technique.
Figure 1B:
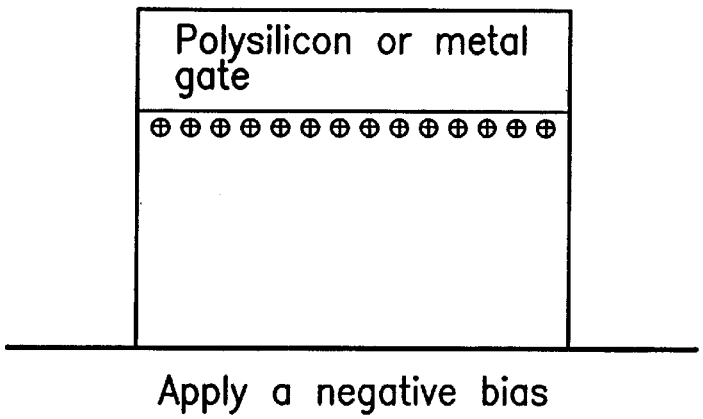
Figure 1C:
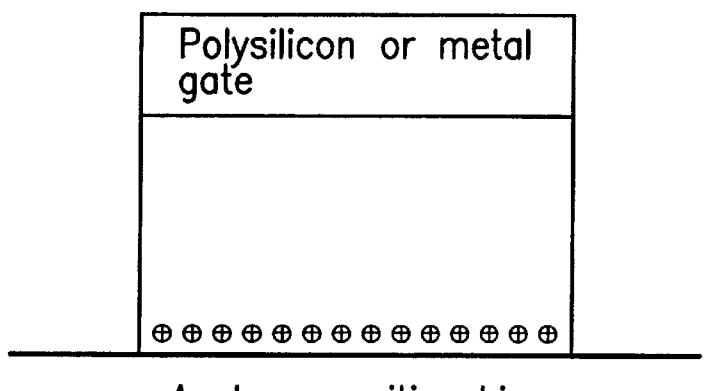
Figure 1D:
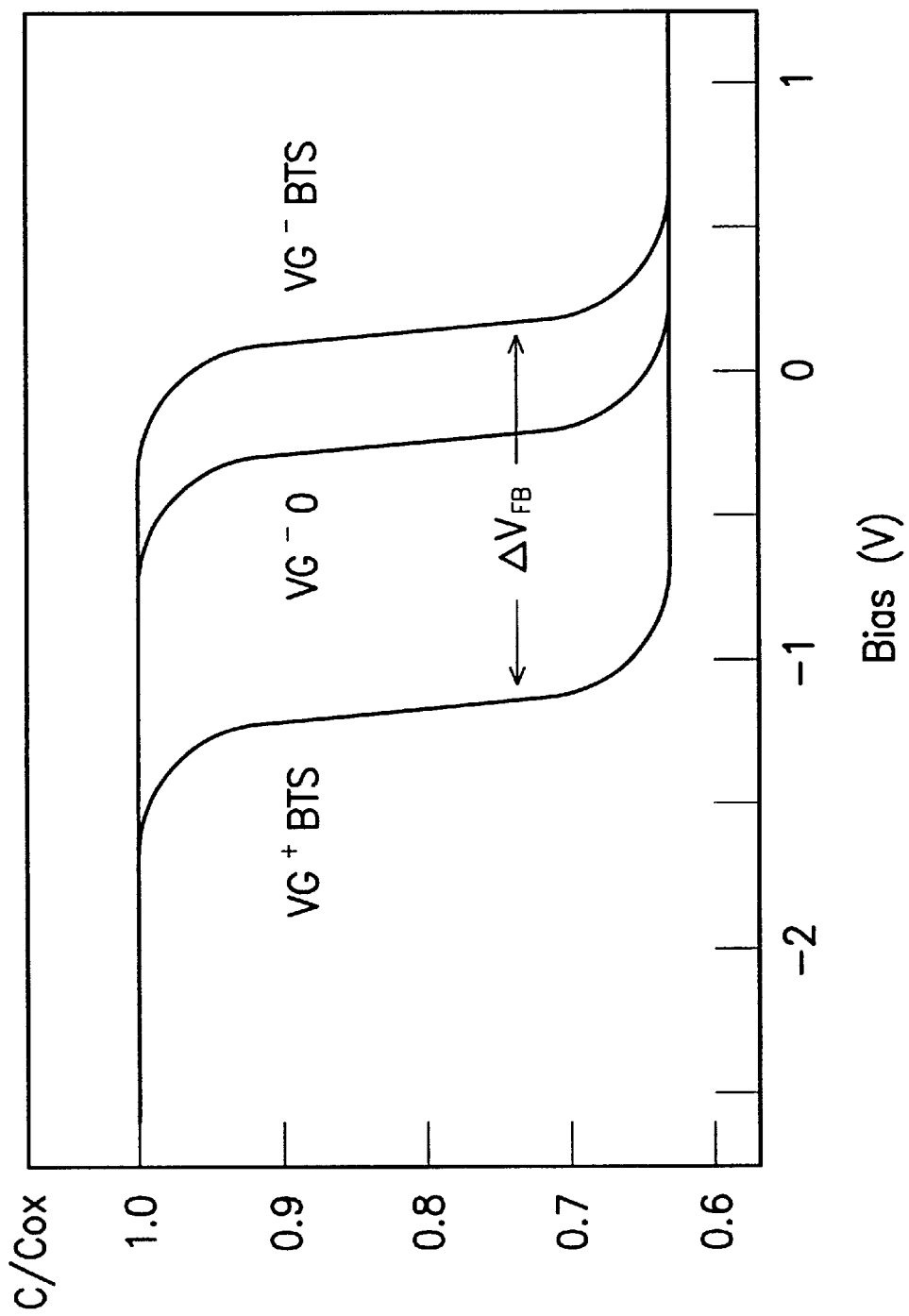
Figure 2A:
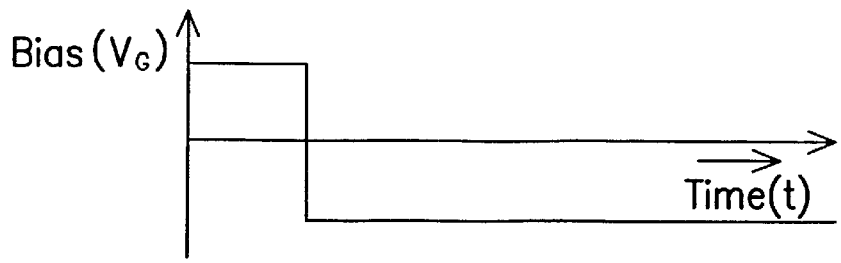
FIGS. 2A~2C are schematic diagrams in which PMIC is measured by using the TVS technique.
Figure 2B:
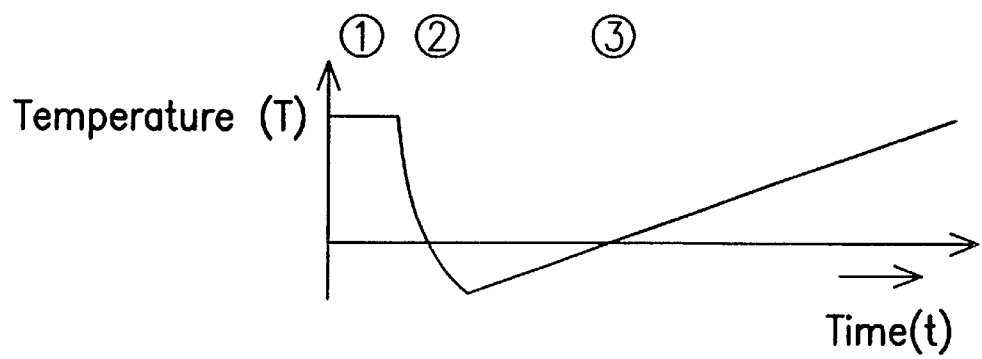
Figure 2C:
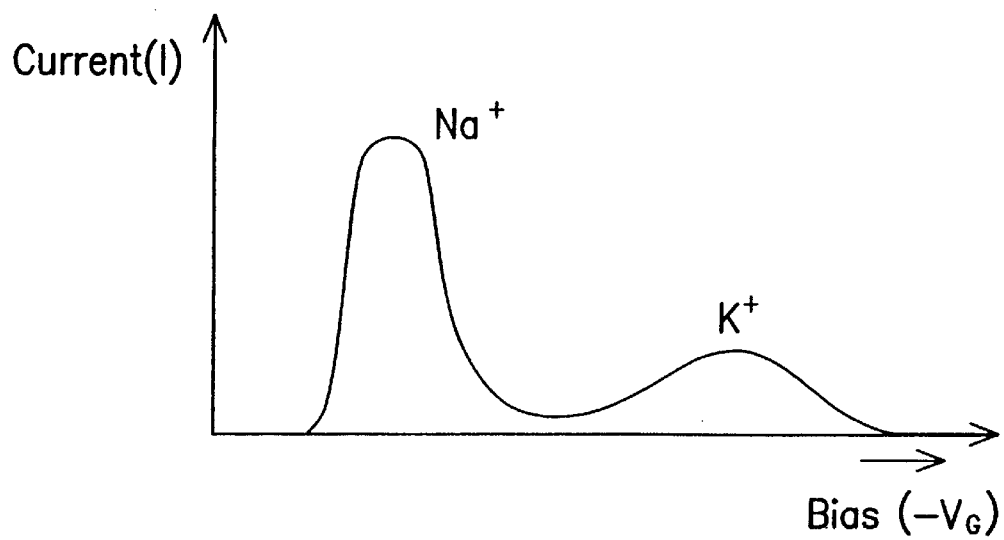
Figure 3A:
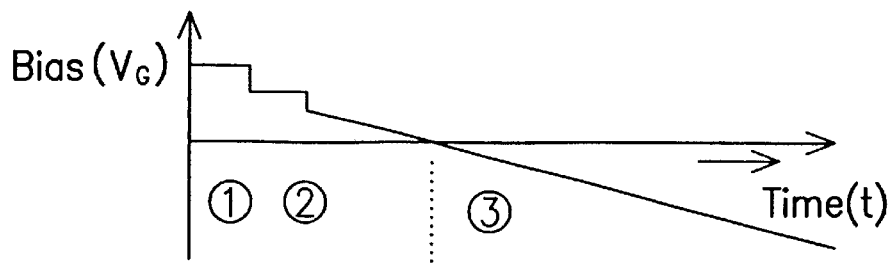
FIGS. 3A~3C are schematic diagrams in which PMIC is measured by using another TVS technique.
Figure 3B:
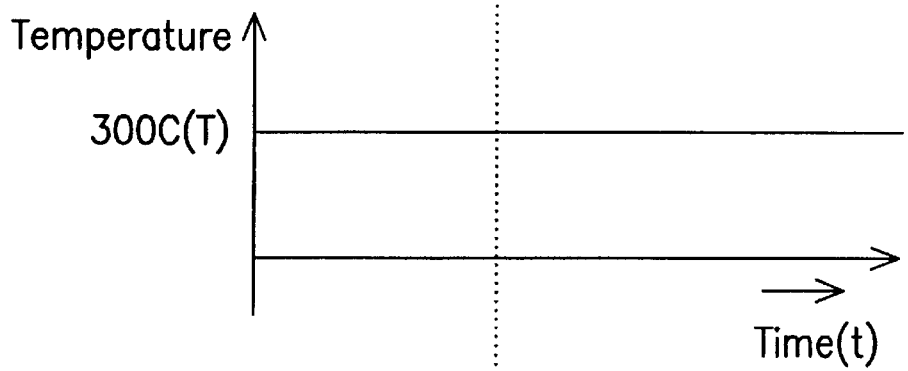
Figure 3C:
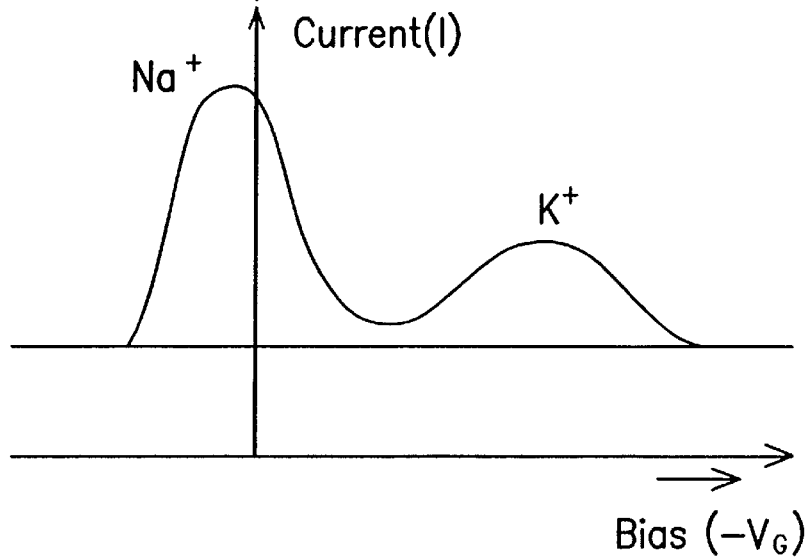
Figure 4:
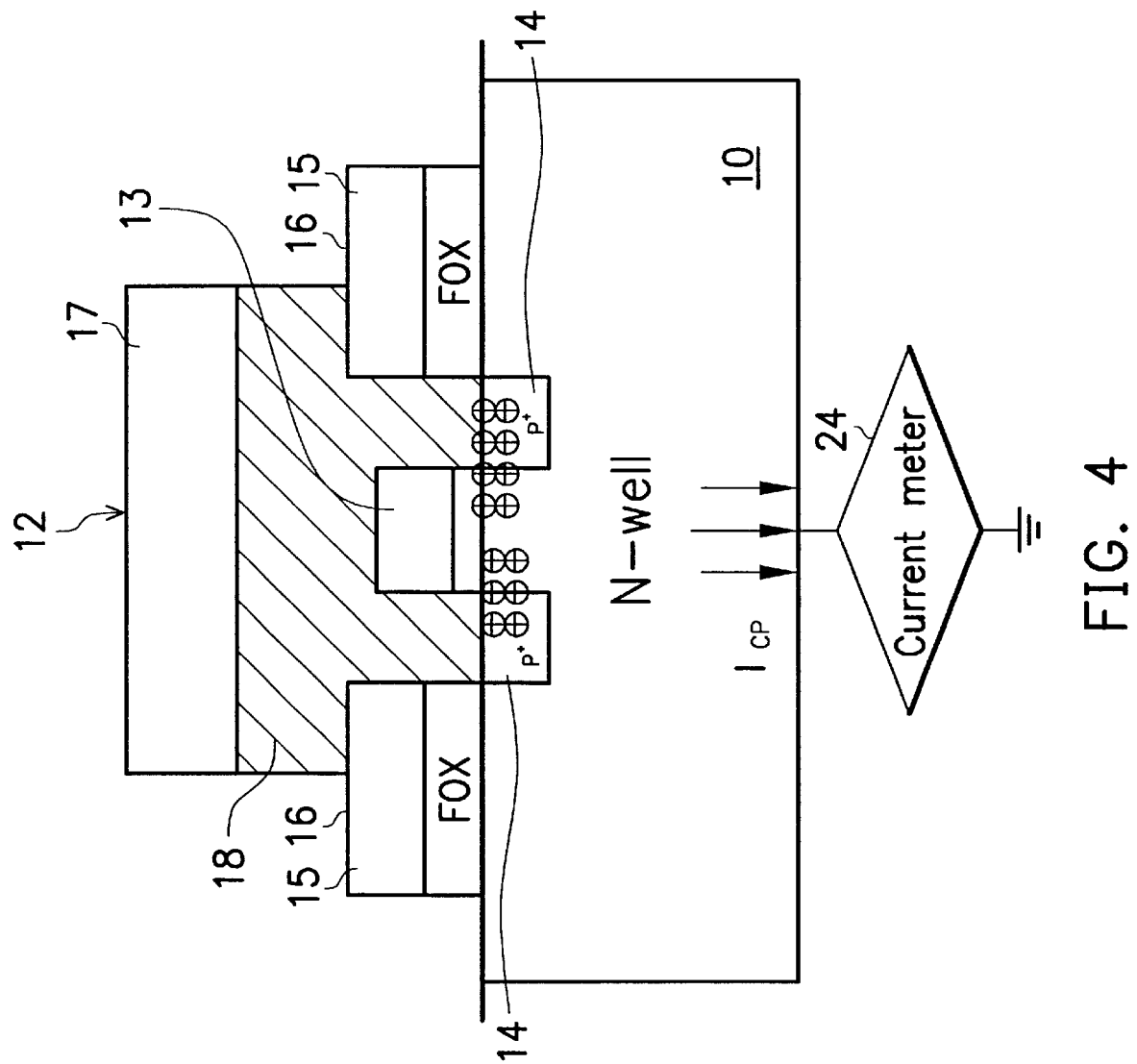
FIG. 4 is a schematic cross-section of the PMIC measuring apparatus according to the invention.

Refer to FIG. 4, which is a schematic cross-section of the PMIC measuring apparatus according to the invention. As shown in the figure, the semiconductor substrate 10 defines an active region 12 by using the field oxide layers (FOX), wherein a gate 13 and a source/drain region 14 are disposed to construct an MOS transistor. The measuring apparatus of MPIC according to the invention comprises a poly heater 15, a metal wound wire 16 of the Kelvin structure and a polysilicon or metal gate 17(called the metal gate 17 below). The poly heater 15 is obtained by depositing a polysilicon layer over the surfaces of the field oxide layers (FOX). The metal wound wire 16 of the Kelvin structure is obtained by distributing metal wound wire over the surface of the polysilicon layer. The metal gate 17 is obtained by depositing a metal layer above the MOS transistor.

Now, the operation of the invention will be explained. In this embodiment, the power dissipation produced by the poly heater 15 can be expressed as:

$$I_P^2 \times R = I_P^2 \times R_0(1 + TCR_{POLY} \times \Delta T)$$

where $I_P$ is a current applied to the poly heater 15, $R_0$ is resistance of the poly heater 15 at room temperature, $TCR_{POLY}$ is a resistance temperature coefficient (about 0.04%/°C. when −65<T<400)of the poly heater 15, and $\Delta T$ is a temperature change of the poly heater 15.

Since the semiconductor substrate 10 (especially the silicon substrate) is a good thermal conductor and can be regarded as a very large thermal sink compared with the local area, the majority of the power dissipation caused by the poly heater 15 is downward. Therefore, if $W_P$ represents the width of the polysilicon layer, $L_P$ represents the length of the polysilicon layer, K represents the thermal conductivity of polysilicon material, h represents the thickness of the field oxide FOX, the current IP applied to the poly heater 15 can be deduced from a temperature change $\Delta T$ by using the following equation:

$$I_P^2 \times R_0(1 + TCR_{POLY}\Delta T) = KW_PL_P\Delta T/h$$

For example, a current of 500 mA needs to be applied to heat the poly heater 15 to the temperature of 400° C. Further, the invention also uses the metal wound wire 16 of the Kelvin structure to instantly detect the temperature of the poly heater 15, to accordingly adjust the testing temperature to within the temperature error of 1%.

Figure 5:
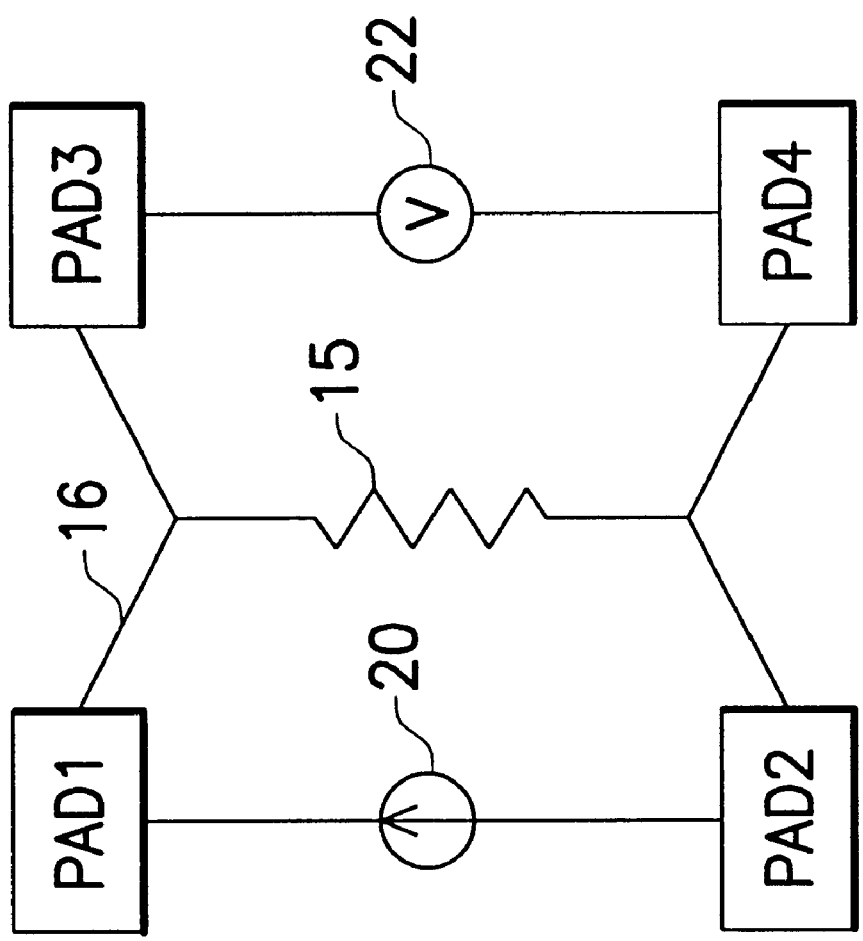
FIG. 5 is a plane schematic diagram for the Kelvin structure in FIG. 4.

The method for taking the temperature of the semiconductor substrate 10 by using the metal wound wire 16 of the Kelvin structure is as follows: First, a set of aluminum wire is wound across the poly heater 15, as shown in FIG. 5. Then, a current supply 20 is disposed between the pad 1 and the pad 2, and a voltage meter 22 is disposed between the pad 3 and the pad 4. Thus, the resistance of the aluminum wire on the poly heater 15 can be deduced by using the following equation:

$$Rm = V/I^{I \to 0}$$

In practical application, the current supply 20 are usually chosen to be under 5 mA in order to avoid the measurement error caused by metal self heating. Besides, the resistance of the aluminum wire, like the poly heater 15, somewhat increases as the temperature increases. It can be expressed as follows:

$$R_m = R_{mo}(1 + TCR_m \times \Delta T)$$

where $R_{mo}$ is resistance of aluminum wire at room temperature, $TCR_m$ (about 0.3% /°C.) is a resistance temperature coefficient of aluminum. $\Delta T$ is a temperature change of the poly heater 15.

Therefore, the real temperature of the poly heater 15 can be calculated through the resistance change of aluminum wire. For example, if the temperature rises to 400° C., the aluminum wire will be 2.1 times the resistance at room temperature.

Figure 6:
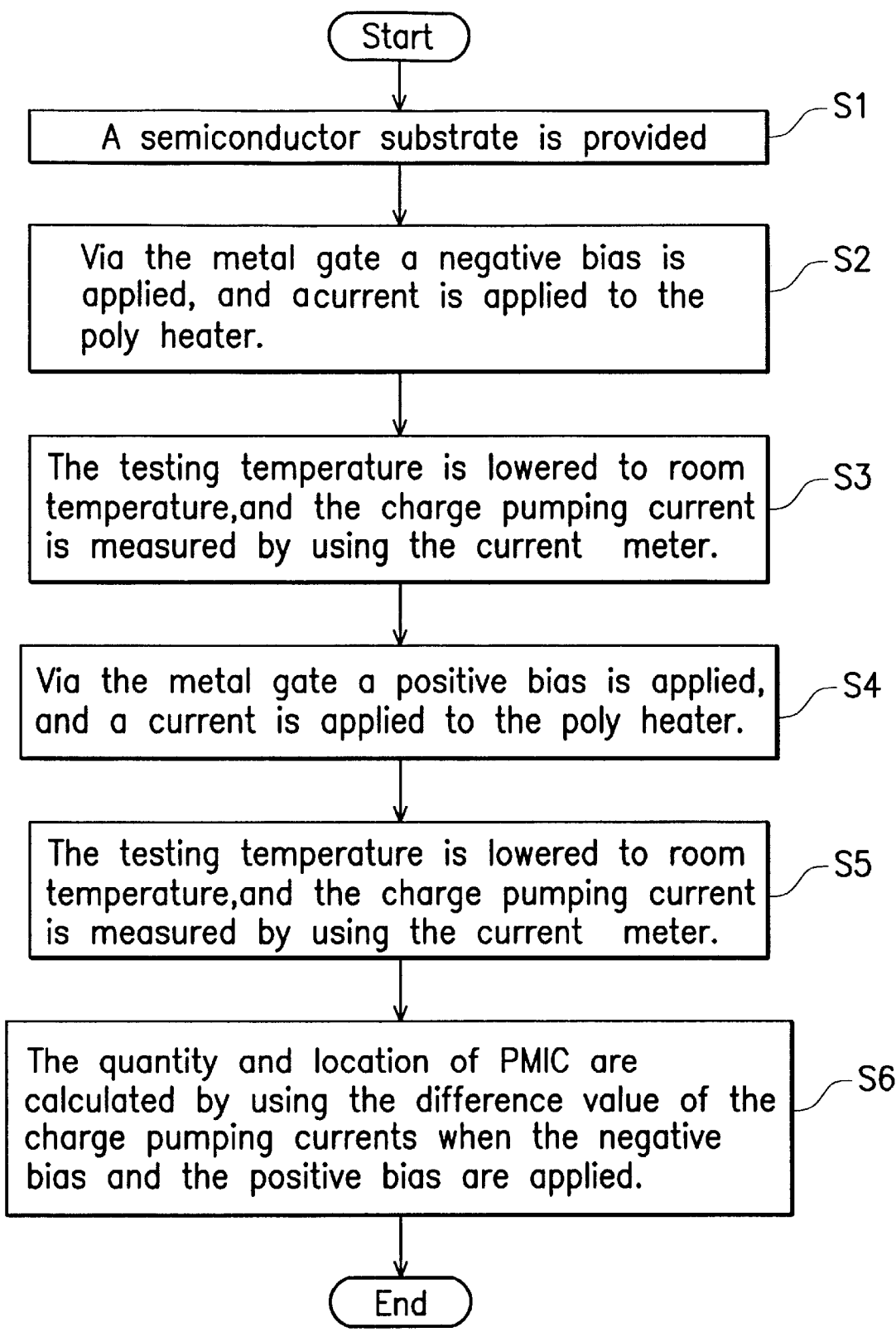
FIG. 6 is a flowchart of the PMIC measuring method according to the invention.

Refer to FIG. 6, which is the flowchart for measuring PMIC according to the invention.

First, as shown in the step S1, a semiconductor substrate 10 is provided. Further, PMIC is randomly distributed in the dielectric layer 18 between the metal gate 17 and the gate 13 on the semiconductor substrate 10, as shown in FIG. 4.

Then, as shown in the step S2, a negative bias of about −1~−2V is applied via the metal gate 17 so as to attract the mobile positive contamination to the interface between the dielectric layer 18 and the metal gate 17 and a current is applied to the poly heater 15, so as to raise the temperature of the whole semiconductor substrate 10 to 400° C. for about one minute. At this stage, the gate 13 and the source/drain region 14 of the MOS transistor are connected to the ground (0V), and the semiconductor substrate 10 is connected to the ground (0V).

Then, as shown in the step S3, the testing temperature is lowered to room temperature, and the charge pumping current, represented by $I_{CPO}$, of the semiconductor substrate 10 is measured by using the current meter 24.

Then, as shown in the step S4, a positive bias of about +1~+2V is applied via the metal gate 17 so as to push the PMIC to the interface between the dielectric layer 18 and the MOS transistor(the gate 13 and the source/drain region 14), and a current is applied to the poly heater 15 so as to raise the temperature of the whole semiconductor substrate 10 to 400° C. for about one minute. Then, the gate 13 of the MOS transistor and the semiconductor substrate 10 are connected to the positive power supply (+5V), and the source/drain region 14 of the MOS transistor is connected to the ground (0V).

Then, as shown in the step S5, the testing temperature is lowered to room temperature, and the charge pumping current, represented by $I_{CPI}$, of the semiconductor substrate 10 is measured by using the current meter 24.

Then, as shown in the step S6, when the negative bias and the positive bias are separately applied, the charge pumping current difference value ($I_{CPI}-I_{CPO}$) is used as the corresponding value of mobile ions so as to calculate the quantity and location of PMIC.

To sum up the above, the apparatus and method for MPIC detection according to the invention may rapidly calculate the quantity and location of PMIC during the WLR test.

Further, the apparatus and method for PMIC detection according to the invention may effect the measurement within a short time by using the power dissipation produced by the polysilicon resistor to raise the kinetic energies of $Na^+$ and $K^+$.

Further, the apparatus and method for MPIC detection according to the invention may complete the measurement of PMIC nondestructively with the advantages of low cost and high resolution.

While the invention is thus disclosed with reference to a preferred embodiment as above, it will be obvious that the same may be varied in many ways. Such variations are not regarded as a departure from the spirit and scope of the invention, and all such modification are intended to be included within the scope of the following claims.

What is claimed is:

1. A positive mobile icon contamination (PMIC) detection apparatus, disposed on a semiconductor substrate having field oxide layers defining an active region in which an MOS transistor is disposed, comprising:

a heating device, disposed on the surfaces of the field oxide layers to heat the semiconductor substrate;

a temperature-taking device, disposed on the surface of the heating device to take the temperature of the semiconductor substrate wherein the temperature-taking device is aluminum wire of a Kelvin structure; and a gate, disposed above the MOS transistor to receive a bias, wherein the temperature of the semiconductor substrate is detected within an error margin of 1%, calculated through the resistance change of the aluminum wire of the Kelvin structure, as determined by the following formula:

$$Rm = Rmo(1 + TCRm \times \Delta T),$$

wherein Rm is the resistance of the aluminum wire, Rmo is the resistance of the aluminum wire at room temperature, TCRm is a resistance temperature coefficient of aluminum, and $\Delta T$ is the temperature change from room temperature.

2. The positive mobile iron contamination (PMIC) detection apparatus as claimed in claim 1, wherein the heating device is a polysilicon layer.

3. The positive mobile iron contamination (PMIC) detection apparatus as claimed in claim 1, further comprising an externally connected current meter for measuring the charge pumping current of the semiconductor substrate.

4. The positive mobile iron contamination (PMIC) detection apparatus as claimed in claim 1, wherein the gate is a metal gate.

5. The positive mobile iron contamination (PMIC) detection apparatus as claimed in claim 1, wherein the gate is a polysilicon gate.

* * * * *